(12) United States Patent
Bar-David et al.

(10) Patent No.: US 6,831,519 B2
(45) Date of Patent: Dec. 14, 2004

(54) EFFICIENT SUPPLY ENHANCEMENT CIRCUITRY FOR POWER AMPLIFIERS

(75) Inventors: Israel Bar-David, Haifa (IL); Ilya Blayvas, Haifa (IL)

(73) Assignee: Paragon Communications Ltd., Haifa (IL)

(*) Notice: Subject to any disclaimer, the term of this patent is extended or adjusted under 35 U.S.C. 154(b) by 0 days.

(21) Appl. No.: 10/418,631

(22) Filed: Apr. 18, 2003

(65) Prior Publication Data

US 2003/0231062 A1 Dec. 18, 2003

(30) Foreign Application Priority Data

Jun. 3, 2002 (IL) ................................................ 150007

(51) Int. Cl.[7] .............................................. H03F 3/04
(52) U.S. Cl. .................................................. 330/297
(58) Field of Search ................................. 330/297, 296

(56) References Cited

U.S. PATENT DOCUMENTS

| | | | | |
|---|---|---|---|---|
| 3,900,823 A | * | 8/1975 | Sokal et al. ................. | 330/149 |
| 5,423,078 A | * | 6/1995 | Epperson et al. ........ | 455/553.1 |
| 5,450,036 A | * | 9/1995 | Nishioka et al. ............. | 330/273 |
| 6,614,309 B1 | * | 9/2003 | Pehlke ........................ | 330/296 |
| 2001/0054931 A1 | | 12/2001 | Bar-David | |

FOREIGN PATENT DOCUMENTS

| WO | 0167598 | 9/2001 | ............. H03G/3/00 |
|---|---|---|---|

OTHER PUBLICATIONS

International Search Report for PCT/IL03/00364, mailed Sep. 15, 2003.

* cited by examiner

*Primary Examiner*—Patricia Nguyen
(74) *Attorney, Agent, or Firm*—Baker Botts LLP

(57) ABSTRACT

Circuitry for allowing efficient pulse-type enhancement of the voltage supplied to a power amplifier fed by a power supply that is connected to the power amplifier at a first feeding point through a main supply path that is connected via a component having high impedance to an enhancement pulse at the feeding point, and to a second feeding point.

10 Claims, 2 Drawing Sheets

EFFICIENT SUPPLY ENHANCEMENT CIRCUITRY FOR POWER AMPLIFIERS

FIELD OF THE INVENTION

The present invention relates to the field of high efficiency power amplifiers. More particularly, the invention relates to a circuitry for efficiently controlling the impedance at a connection point of a power supply to a power amplifier, being a feeding point, and providing enhancement of the voltage that is delivered to said power amplifier via an supplementary supply path that is used to connect the power supply to that point.

BACKGROUND OF THE INVENTION

Several RF systems containing power amplifiers are characterized in recurrent periods of signals having large peak excursions, which should be handled, in order to improve the efficiency of these systems. One way to handle signals with large peak-to-average ratios is to control the DC power supply to a power amplifier. One voltage level is supplied to such a power amplifier whenever the instantaneous amplitude is below a given level (normal operating condition), and an enhanced (and higher) voltage level whenever the instantaneous amplitude is above said level. This solution is described for example, in WO 01/67598, which discloses circuitry for dynamically enhancing the operating voltage of an RF amplifier. However, efficiency of the voltage enhancement circuit disclosed therein may be further increased by controlling the impedance values at the connection point between the power amplifier and the power supply, during normal operation and during voltage enhancement time periods.

It is therefore desired to allow a power amplifier to work under different operating power supply voltages, in response to different input signals or conditions under which the power amplifier, or a component contained within it, operates. For example, in order to optimize the operation of a power amplifier, it would be beneficial to provide it with a DC power through a first supply path whenever the signal at its input is below a predetermined level, and add a second supplemental power supply path at instants wherein the signal at its input is above that level, thus enhancing the effective voltage supplied to said power amplifier. This type of solution allows operating a power amplifier in a relatively large dynamic range with high efficiency, as the enhanced operating voltage source is coupled to the circuit only when required by the large instantaneous amplitude.

It is an object of the present invention to provide circuitry that allows efficient enhancement of the voltage supplied to a power amplifier during required time periods.

It is another object of the present invention to provide circuitry for efficiently controlling the level of the voltage supplied to a power amplifier, via a supplementary supply path that is connected to the feeding point, during both the enhancement period, and periods of normal operation.

It is another object of the present invention to provide circuitry for efficiently controlling the impedance at that feeding point in the direction of the power amplifier and of the supplementary supply path, during both the enhancement period, and periods of normal operation.

Other objects and advantages of the invention will become apparent as the description proceeds.

SUMMARY OF THE INVENTION

The present invention is directed to a method for allowing efficient pulse-type enhancement of the voltage supplied to a power amplifier fed by a power supply being connected to the power amplifier at a first feeding point through a main supply path connected via a component, such as an inductor or a diode, having a high impedance to an enhancement pulse at the feeding point, and to a second feeding point. A supplementary supply path is provided, for enhancing the operating voltage to the power amplifier from the power supply, or from another power supply. A pair of a first and a second controllable impedances, such as a bipolar transistor or a FET, which are connected by a common contact are provided. Each controllable impedance is capable of being in a non-conducting state or in a variable level of conduction. One contact of the first controllable impedance is connected to the second feeding point, while the power supply, or another power supply, is connected across the contacts of the pair which are not connected at the common contact. A capacitor is connected between the common contact and the first feeding point. During the time period when no enhancement is required, simultaneously the first controllable impedance is caused to be in its conducting state and effectively connect the common contact to the second feeding point of the power supply, or another power supply, and the second controllable impedance is simultaneously caused to be in its non-conducting state and thereby, to effectively disconnect the common contact from the second feeding point and to allow the capacitor to charge to essentially the voltage of the power supply. During the time period when enhancement is required, the first controllable impedance effectively disconnects the common contact from one contact of the power supply, or another power supply, and the second controllable impedance is simultaneously controlled to be in a conduction level that corresponds to a desired enhancement voltage at the first feeding point, so as to increase the magnitude of the voltage at the common point, to which a contact of the capacitor is connected, and to cause an essentially similar increase in the voltage at the first feeding point, to which the other contact of the capacitor is connected.

Preferably, during the time period when enhancement is required, the first and/or the second controllable impedances are controlled by pulse signals having duration which is essentially similar to that time period.

The present invention is also directed to a circuitry for allowing efficient pulse-type enhancement of the voltage supplied to a power amplifier fed by a power supply being connected to the power amplifier at a first feeding point through a main supply path connected via a component having a high impedance to an enhancement pulse at the feeding point, such as an inductor or a diode, and to a second feeding point, that comprises:

a) a supplementary supply path for providing enhanced operating voltage to the power amplifier from the, or from another power supply;

b) a pair of a first and a second controllable impedances, such as a bipolar transistor or a FET, being connected by a common contact, each of which being capable of being in a non-conducting state or in a variable level of conduction, one contact of the first controllable impedance being connected to the second feeding point;

c) a power supply, being the, or another power supply, being connected across the contacts of the pair, which are not connected at the common contact, for providing enhanced operating voltage to the power amplifier;

d) a capacitor being connected between the common contact and the feeding point, for supplying at least a portion of the enhancement voltage through the feeding point during the time period;

e) circuitry for, simultaneously causing the first controllable impedance to be in its conducting state and effectively connect the common contact to the second feeding point of the, or another power supply, and the second controllable impedance to be in its non-conducting state, during the time period when no enhancement is required, and for causing the first controllable impedance to effectively disconnect the common contact from one contact of the, or another power supply and for simultaneously, controlling the second controllable impedance to be in a conduction level that corresponds to a desired enhancement voltage at the first feeding point, during the time period when enhancement is required.

BRIEF DESCRIPTION OF THE DRAWINGS

The above and other characteristics and advantages of the invention will be better understood through the following illustrative and non-limitative detailed description of preferred embodiments thereof, with reference to the appended drawings, wherein.

DETAILED DESCRIPTION OF PREFERRED EMBODIMENTS

Figure 1:
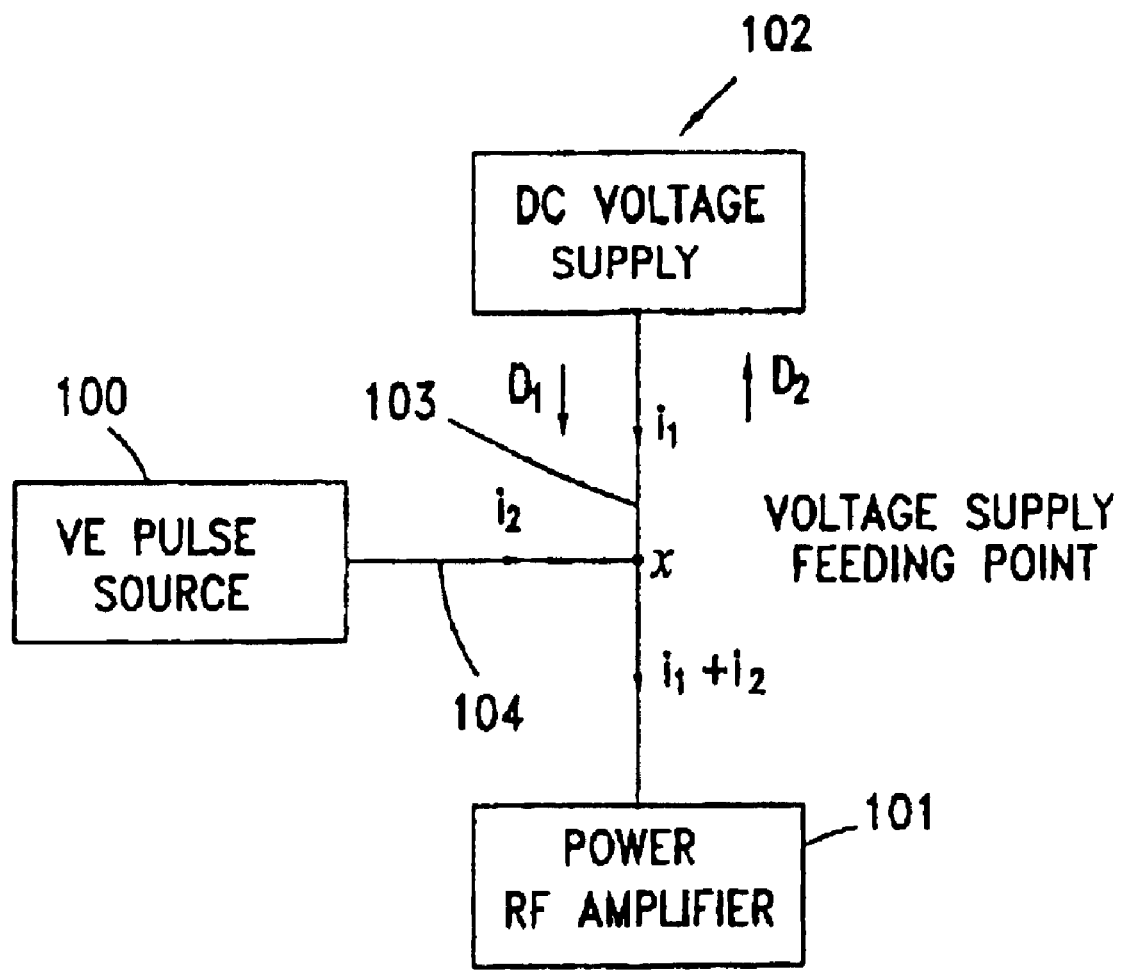
FIG. 1 is a block diagram of a circuitry that controls the level of enhancement of the voltage supplied to a power amplifier, according to a preferred embodiment of the invention.

FIG. 1 is a block diagram of a circuitry that controls the level of enhancement of the voltage supplied to a power amplifier, according to a preferred embodiment of the invention. The power amplifier 101 is supplied with operating voltage through a feeding point x, which is connected to a DC voltage supply 102 via the main supply path 103, and to a voltage enhancement pulse source 100, via a supplementary supply path 104. The Voltage Enhancement (VE) circuitry 100 increases the supply voltage at the feeding point x for a relatively short duration (in the order of the reciprocal of the modulation bandwidth), when voltage enhancement is required. Under normal operation conditions (i.e., when no enhancement is required), the feeding point x has an extremely low resistance to the DC current $i_1$ consumed from the DC voltage supply circuitry 102 (in the direction D1). During the same normal operation period, the VE pulse source 100 causes feeding point x to have an extremely low impedance to all the frequency components of the fluctuating current $i_2$ generated by the power amplifier 101.

According to a preferred embodiment of the invention, during the relatively short duration when a (large) peak in $i_2$ is required, the VE pulse source 100 issues a VE pulse and the DC voltage supply 102 concurrently allows the feeding point x to have a high impedance in the direction D2, such that the VE pulse is fully directed into the power amplifier 101, rather than being short-circuited into the DC voltage supply 102. Therefore, during the VE period the effective current $i_1+i_2$, supplied to the power amplifier 101 comprises an enhanced component $i_2$, as required by the large instantaneous amplitude of the RF signal amplified by the power amplifier 101.

Figure 2:
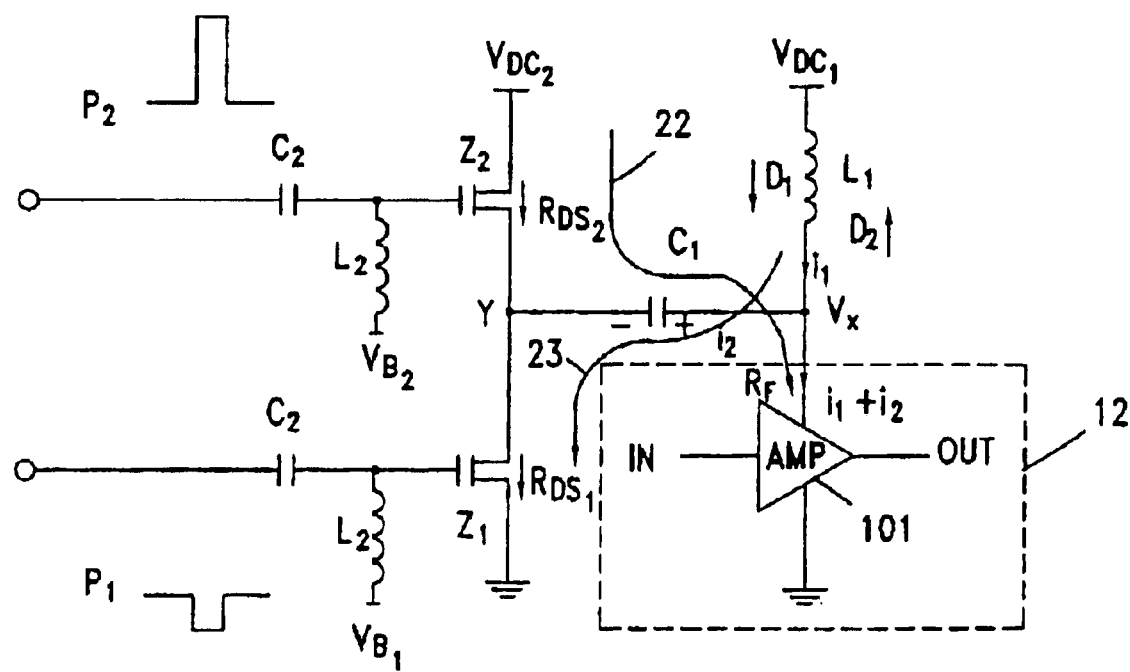
FIG. 2 schematically illustrates an implementation of a circuitry that controls the level of enhancement of the DC power that is supplied to a power amplifier, according to a preferred embodiment of the invention.

FIG. 2 schematically illustrates an implementation of the circuitry of FIG. 1, according to a preferred embodiment of the invention. The VE circuitry 100 consists of two serially connected controllable impedances and (e.g., FETs or bipolar transistors), which are also connected between the contacts of the power supply $V_{DC_1}$, or of a supplementary power supply $V_{DC_2}$. The power supply $V_{DC_1}$, used to supply power to the power amplifier 101 under normal operation conditions, is connected to the feeding point x through a serial inductor $L_1$, which is selected to introduce extremely high impedance to the issued VE pulse, in the direction D2. The common point of controllable impedances Z1 and Z2 is connected to the voltage supply feeding point by a capacitor $C_1$. The value of $C_1$ is selected to introduce low impedance to all the frequency components of the fluctuating current generated by the power amplifier 101. In addition, the value of $C_1$ should be sufficiently large for supplying the excess current $i_2$ for the (short) duration when the VE pulse is issued. During normal operation, the fluctuating components of $i_2$ flow through capacitor C1.

Controllable impedances Z1 and Z2 are implemented in this example using Field-Effect-Transistors (FETs), each of which is properly biased by an inductor $L_2$ (which also serves as a choke for the exciting pulses, P1 and P2) connecting their gates to the biasing voltages $V_{B1}$ and $V_{B2}$, respectively. Controllable impedances Z1 and Z2 are controlled by separate control pulses, P1 and P2, respectively, through corresponding serial capacitors C2, which serve as DC-blocks (in order to isolate the control signals from the biasing voltages $V_{B1}$ and $V_{B2}$.

$V_{B1}$ is selected such that during normal operation conditions, Z1 is in full conduction, effectively short-circuiting point y to ground by becoming a negligible impedance to ground, such that the voltage at point y is zero. $V_{B2}$ is selected such that during normal operation conditions, Z2 is effectively an open-circuit. In this state, the supplemental $V_{DC_2}$ essentially disconnected from the feeding point x. Consequently, $i_2$ flows through C1 and Z1 to ground, as required for proper operation of the power amplifier 101, while $i_1$ flows through capacitor C1. Simultaneously, capacitor C1 is charged to a voltage that essentially equals $V_{DC_1}$.

When VE is required, Z1 is forced by P1 to enter into its non-conducting state, having effectively infinite impedance, thereby effectively disconnecting $C_1$ from ground. Simultaneously, Z2 is allowed to be in a conducting level that corresponds to the amount of VE that is required, by properly controlling the level of P2. This allows the voltage at point y to rise above zero and by virtue of capacitor C1, to enhance the voltage at point x. At this stage, C1 discharges into the power amplifier 101 through the feeding point x, thereby causing the supplemental current $i_2$ to flow in direction 22 for the duration of the control pulse $P_2$. The level of enhancement depends on the value of the impedance $R_{DS_2}$ (i.e., the impedance of Z2 while being in the appropriate conducting measure). Lower value of $R_{DS_2}$ results in higher level of enhancement. The duration of the VE pulse is determined by the duration of the control pulse P2. The voltage level $V_X$ at the feeding point x increases at the switching moment by a level determined by $R_{DS_2}$ and the value of $V_{DC_2}$. The maximum value of enhancement is obtained when $R_{DS_2}=0$ and when $V_x$ equals the sum of the voltage $V_{DC_2}$ and the voltage across capacitor C1, which is $V_{DC_1}+V_{DC_2}$. During the VE period, capacitor C1 discharges slightly, while participating in the VE process.

After the enhancement period is terminated, that is the control pulses P1 and P2 are terminated and Z2 returns to its non-conducting state. Concurrently, Z1 is controlled to re-enter its conducting state, also allowing C1 to recharge via path 23 to $V_{DC_1}$ and be ready for the next required VE period.

The above examples and description have of course been provided only for the purpose of illustration, and are not intended to limit the invention in any way. As will be appreciated by the skilled person, the invention can be carried out in a great variety of ways, employing more than one technique from those described above, all without exceeding the scope of the invention.

What is claim is:

1. A method for allowing efficient pulse-type enhancement of the voltage supplied to a power amplifier fed by a power supply being connected to said power amplifier at a first feeding point through a main supply path connected via a component having a high impedance to an enhancement pulse at said feeding point, and to a second feeding point, comprising:
   a) providing a supplementary supply path for providing enhance operating voltage to said power amplifier from one of said power supply and a second power supply;
   b) providing a pair of a first and a second controllable impedances being connected by a common contact, each of which having a separate control input and being capable of being in a non-conducting state, and at least one of which is capable of being in a desired variable level of conduction, up to full conduction;
   c) connecting one contact of said first controllable impedance to said second feeding point;
   d) connecting one of said power supply and said second power supply across the contacts of said pair which are not connected at said common contact;
   e) connecting a capacitor between said common contact and said first feeding point;
   f) during the time period when no enhancement is required, simultaneously and separately controlling said first controllable impedance, through its separate control input, to be in its conducting state and effectively connect said common contact to said second feeding point of one of said power supply and said second power supply, and controlling said second controllable impedance, through its separate control input, to be in its non-conducting state and thereby, effectively disconnecting said common contact from said second feeding point and allowing said capacitor to charge to essentially the voltage of said power supply;
   g) during the time period when enhancement is required:
      g.1) controlling said first controllable impedance, through its separate control input, to effectively disconnect said common contact from one contact of said, or another power supply and;
      g.2) simultaneously and separately, controlling said second controllable impedance, through its separate control input, to be in a conduction level that corresponds to a desired enhancement voltage level at said first feeding point, thereby increasing the magnitude of the voltage at said common point, to which a contact of said capacitor is connected, and thereby causing an essentially similar increase in the voltage at said first feeding point, to which the other contact of said capacitor is connected, up to said desired enhancement voltage level.

2. A method according to claim 1, wherein the controllable impedance comprises a bipolar transistor.

3. A method according to claim 1, wherein the controllable impedance comprises a FET.

4. A method according to claim 1, wherein the component comprises an inductor.

5. A method according to claim 1, wherein during the time period when enhancement is required, the first and/or the second controllable impedances are controlled by pulse signals having duration which is essentially similar to said time period.

6. Circuitry for allowing efficient pulse-type enhancement of the voltage supplied to a power amplifier fed by a power supply being connected to said power amplifier at a first feeding point through a main supply path connected via a component having a high impedance to an enhancement pulse at said feeding point, and to a second feeding point, comprising:
   a) a supplementary supply path for providing enhanced operating voltage to said power amplifier from one of said power supply and a second power supply;
   b) a pair of a first and a second controllable impedances being connected by a common contact, each of which having a separate control input and being capable of being in a non-conducting state and at least one of which is capable of being in a desired variable level of conduction, up to full conduction, one contact of said first controllable impedance being connected to said second feeding point;
   c) one of a power supply and a second power supply, being connected across the contacts of said pair, which are not connected at said common contact, for providing enhanced operating voltage to said power amplifier;
   d) a capacitor being connected between said common contact and said feeding point, for supplying at least a portion of said enhancement voltage through said feeding point during enhancement time period;
   e) control circuitry, having at least two separate control ports, for simultaneously and separately, controlling said first controllable impedance, by a pulse-type control signal provided through its separate control input, to be in its conducting state and effectively connect said common contact to said second feeding point of one of said power supply and said second power supply, and said second controllable impedance, by another pulse-type control signal provided through its separate control input, to be in its non-conducting state, for causing said first controllable impedance to effectively disconnect said common contact from one contact of said, or another power supply during the time period when no enhancement is required, and
   for simultaneously and separately, controlling said first controllable impedance, by a pulse-type control signal provided through its separate control input, to be in its non-conducting state and effectively disconnect said common contact from said second feeding point of said, or another power supply, and said second controllable impedance, through its separate control input, to be in a conduction level that corresponds to a desired enhancement voltage level at said first feeding point, during the time period when enhancement is required, such that the magnitude of the voltage at said common point is increased essentially up to said desired enhancement voltage level.

7. Circuitry according to claim 6, wherein the controllable impedance comprises a bipolar transistor.

8. Circuitry according to claim 6, wherein the controllable impedance comprises a FET.

9. Circuitry according to claim 6, wherein the component comprises an inductor.

10. Circuitry according to claim 6, wherein during the time period when enhancement is required, the first and/or the second controllable impedances are controlled by pulse signals having a duration which is essentially similar to said time period.

* * * * *